(12) United States Patent
Katti

(10) Patent No.: US 7,053,429 B2
(45) Date of Patent: May 30, 2006

(54) BIAS-ADJUSTED GIANT MAGNETORESISTIVE (GMR) DEVICES FOR MAGNETIC RANDOM ACCESS MEMORY (MRAM) APPLICATIONS

(75) Inventor: Romney R. Katti, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 185 days.

(21) Appl. No.: 10/702,974

(22) Filed: Nov. 6, 2003

(65) Prior Publication Data

US 2005/0098807 A1   May 12, 2005

(51) Int. Cl.
    *H01L 31/119*   (2006.01)
(52) U.S. Cl. .................. 257/295; 257/295; 257/296
(58) Field of Classification Search ................ 257/295, 257/296, 422
    See application file for complete search history.

(56) References Cited

U.S. PATENT DOCUMENTS

| | | | |
|---|---|---|---|
| 5,442,508 A * | 8/1995 | Smith ......................... 360/314 |
| 5,496,759 A | 3/1996 | Yue et al. |
| 5,546,253 A * | 8/1996 | Che ......................... 360/324.1 |
| 5,861,328 A | 1/1999 | Tehrani et al. |
| 5,940,319 A | 8/1999 | Durlam et al. |
| 6,048,739 A | 4/2000 | Hurst et al. |
| 6,153,443 A | 11/2000 | Durlam et al. |
| 6,165,803 A | 12/2000 | Chen et al. |
| 6,174,737 B1 | 1/2001 | Durlam et al. |
| 6,211,090 B1 | 4/2001 | Durlam et al. |
| 6,252,796 B1 * | 6/2001 | Lenssen et al. ............. 365/173 |
| 6,392,922 B1 | 5/2002 | Liu et al. |
| 6,452,764 B1 * | 9/2002 | Abraham et al. ........ 360/324.2 |
| 6,500,676 B1 | 12/2002 | Ramberg |
| 6,636,393 B1 * | 10/2003 | Araki et al. ........... 360/324.11 |
| 6,730,949 B1 * | 5/2004 | Kishi et al. ................. 257/295 |
| 6,744,086 B1 * | 6/2004 | Daughton et al. .......... 257/295 |
| 6,781,874 B1 * | 8/2004 | Hidaka ....................... 365/171 |
| 6,785,100 B1 * | 8/2004 | Hiramoto et al. ........... 360/321 |
| 2002/0080645 A1 | 6/2002 | Liu et al. |
| 2002/0085412 A1 | 7/2002 | Liu et al. |

FOREIGN PATENT DOCUMENTS

EP        1 033 764      3/2000

* cited by examiner

*Primary Examiner*—David Nelms
*Assistant Examiner*—Thinh T Nguyen
(74) *Attorney, Agent, or Firm*—McDonnell Boehnen Hulbert & Berghoff LLP

(57) ABSTRACT

A bias-adjusted giant magnetoresistive (GMR) device includes a ferromagnetic reference layer, which has a magnetization that remains relatively fixed when a range of magnetic fields is applied, and a ferromagnetic switching layer, which has a magnetization that can be changed by applying a relatively small magnetic field. In MRAM applications, the switching layer stores data in the form of the particular orientation of its magnetization relative to the magnetization of the reference layer. At least one of the reference and switching layers is split into at least two ferromagnetic layers separated by one or more layers of a nonmagnetic conductor, such that the hysteresis curve of resistance versus applied magnetic field is substantially symmetric about zero applied magnetic field.

9 Claims, 7 Drawing Sheets

400

BIAS-ADJUSTED GIANT MAGNETORESISTIVE (GMR) DEVICES FOR MAGNETIC RANDOM ACCESS MEMORY (MRAM) APPLICATIONS

GOVERNMENT RIGHTS

The United States Government has acquired certain rights in this invention pursuant to Contract No. DTRA01-00-C-0002 awarded by DTRA.

BACKGROUND

1. Field

The present invention relates generally to magnetoresistive devices and, more particularly, to giant magnetoresistive devices for magnetic random access memory applications.

2. Related Art

The discovery of the giant magnetoresistive (GMR) effect has led to the development of a number of spin-based electronic devices. The GMR effect is observed in certain thin-film devices that are made up of alternating ferromagnetic and nonmagnetic layers. The resistance of a GMR device is typically lowest when the magnetic moments of the ferromagnetic layers are in a parallel orientation and highest when the magnetic moments are in an antiparallel orientation.

One type of GMR device is commonly referred to as a "spin valve." A spin valve typically includes two ferromagnetic layers that are separated by a thin layer of a non-magnetic metal (usually copper) and also includes an anti-ferromagnetic layer that "pins" the magnetization of one of the ferromagnetic layers. FIG. 1 illustrates (in a simplified form) the layers in a typical spin valve 10. As shown in FIG. 1, spin valve 10 includes ferromagnetic layers 12 and 14 separated by a nonmagnetic layer 16. Ferromagnetic layer 14 is adjacent to an anti-ferromagnetic layer 18, such that the magnetization of ferromagnetic layer 14 is "pinned" in a particular orientation. The arrow in layer 14 indicates an exemplary pinned orientation, though, in general, the orientation could be pinned in either direction. Thus, the magnetization of ferromagnetic layer 14 remains relatively fixed when moderate magnetic fields are applied to spin valve 10. In contrast, the magnetization of ferromagnetic layer 12 is free to switch between parallel and antiparallel orientations, as indicated by the double-arrow symbol in layer 12. Thus, by applying an appropriate magnetic field to spin valve 10, the magnetization of ferromagnetic layer 12 can be changed while the magnetization of ferromagnetic layer 14 remains the same. In this way, applied magnetic fields can change the relative orientations of the magnetizations in ferromagnetic layers 12 and 14, which, in turn, can be detected as a change in resistance. In particular, the resistance of spin valve 10 is typically lowest when the magnetizations of ferromagnetic layers 12 and 14 are parallel and highest when the magnetizations are antiparallel.

Another type of GMR device is commonly referred to as a "pseudo spin valve." Like a spin valve, a pseudo spin valve typically includes two ferromagnetic layers that are separated by a layer of a nonmagnetic metal, with the magnetization of one of the ferromagnetic layers staying relatively fixed when moderate magnetic fields are applied. However, in a pseudo spin valve, this fixed magnetization is a result of a relatively high anisotropy and switching field rather than a result of being pinned. FIG. 2 illustrates (in a simplified form) the layers in a typical pseudo spin valve 20. As shown in FIG. 2, pseudo spin valve 20 includes ferromagnetic layers 22 and 24 separated by a non-magnetic layer 26. Ferromagnetic layer 24 has a relatively high anisotropy and switching field, so that its magnetization remains relatively fixed when moderate magnetic fields are applied to pseudo spin valve 20, as indicated by the arrow symbol in layer 24. In contrast, ferromagnetic layer 22 has a lower anisotropy and switching field, which, in many cases, is achieved by making ferromagnetic layer 24 substantially thicker than ferromagnetic layer 22. As a result, the magnetization of ferromagnetic layer 22 is free to switch between parallel and antiparallel orientations, as indicated by the double-arrow symbol in layer 22. Thus, by applying an appropriate magnetic field to pseudo spin valve 20, the magnetization of ferromagnetic layer 22 can be changed while the magnetization of ferromagnetic layer 24 remains the same. The resistance of pseudo spin valve 20 is typically lowest when the magnetizations of ferromagnetic layers 22 and 24 are parallel and highest when the magnetizations are antiparallel.

GMR devices, including spin valves and pseudo spin valves, can be used as data storage elements in magnetic random access memory (MRAM) devices. In this regard, exemplary MRAM applications of GMR devices are described in U.S. Pat. Nos. 6,147,922; 6,175,525; 6,178,111; and 6,493,258, all of which are incorporated herein by reference. In typical MRAM devices, the logical state of a GMR-based memory element is based on its resistance, which, in turn, is based on the relative orientations of the magnetizations of the ferromagnetic layers. Thus, in one logical state, e.g., a "0" state, a GMR device may have its ferromagnetic layers in a parallel orientation and, thus, may exhibit a low electrical resistance. In the other logical state, e.g., a "1" state, the GMR device may its ferromagnetic layers in an antiparallel orientation and, thus, may exhibit a higher electrical resistance. Data may be written to a GMR-based memory element by applying a magnetic field sufficient to change the magnetization of the "free" ferromagnetic layer, i.e., ferromagnetic layer 12 in spin valve 10 or ferromagnetic layer 22 in pseudo spin valve 20. In this way, the "free" ferromagnetic layer functions as a "switching layer" that stores data in the form of a particular magnetization orientation relative to the other ferromagnetic layer, the "reference layer." Thus, in spin valve 10, ferromagnetic layer 12 may function as the switching layer, and ferromagnetic layer 14 may function as the reference layer. Similarly, in pseudo spin valve 20, ferromagnetic layer 22 may function as the switching layer, and ferromagnetic layer 24 may function as the reference layer.

The magnetic fields used to write data to a GMR-based memory element in an MRAM device are typically generated by a "word" current flowing in a nearby conductor. For example, a word current flowing in one direction may be used to place the GMR-based memory element in one logical state, and a word current flowing in the other direction may be used to place the GMR-based memory element in the other logical state. In particular, in some of the common MRAM architectures, each memory element includes two GMR-devices that are in opposite logical states. Thus, to change the state of the two GRM devices in the memory element, the word current is often arranged to apply magnetic fields of the same magnitude but opposite sign to the two GMR devices. Because of magnetic hysteresis, the switching layer may retain its magnetization orientation relative to the reference layer even when the word current stops and the magnetic field that the current generated is no longer present. In this way, little or no power may be needed in order for a GMR-based memory element to retain its logical state. Accordingly, MRAM devices are generally regarded to be a form of non-volatile data storage.

One difficulty with conventional GMR devices for MRAM applications, e.g., for write and/or read operations, depending on the architecture, is that the hysteresis curve for a GMR device is often substantially "biased," i.e., asymmetric with respect to applied magnetic field. FIG. 3 illustrates such a biased or asymmetric hysteresis curve. In FIG. 3, the vertical axis represents the resistance of an exemplary GMR device, and the horizontal axis represents applied magnetic field. This GMR device exhibits a resistance $R_1$ in zero applied magnetic field, after a magnetic field $H_1$ is applied, and exhibits a resistance $R_0$ in zero applied magnetic field, after a magnetic field $H_0$ is applied. Thus, $R_1$ may represent the resistance of the GMR device in the "1" state, and $R_0$ may represent the resistance of the GMR in the "0" state.

Several disadvantages may result from this asymmetric hysteresis curve. First, because the hysteresis curve is not centered about zero applied magnetic field, the difference between the two zero-field resistances, $R_1$ and $R_0$, may be much smaller than the maximum possible resistance difference possible that the GMR device can exhibit. Second, the asymmetry of the hysteresis curve may cause higher word currents to be required for reliable operation. In particular, since word currents of the same magnitude but different directions are typically used to write data to the GMR devices in an MRAM memory element, a word current that generates an applied magnetic field with magnitude $H_0$ may be insufficient. Flowing in one direction, the word current may be able to place the GMR device in the "0" state with resistance $R_0$. However, when flowing in the other direction, the word current may be unable to place the GMR device in the "1" state with resistance $R_1$. Instead, a higher word current, sufficient to generate an applied magnetic field of magnitude $H_1$ may be required for reliable operation.

Accordingly, there is a need for GMR devices that exhibit hysteresis characteristics that are more compatible with MRAM applications.

SUMMARY

In a first principal aspect, the present invention provides a magnetoresistive device having a resistance that can be changed by applying a magnetic field. The magnetoresistive device comprises a reference layer, a switching layer, and a first nonmagnetic conductor layer between the reference layer and the switching layer. The reference layer has a first magnetization direction that remains substantially fixed when the magnetic field is applied. The switching layer has a second magnetization direction that changes orientation relative to the first magnetization direction when the magnetic field is applied. At least one of the reference and switching layers includes at least a first ferromagnetic layer, a second ferromagnetic layer, and a second nonmagnetic conductor layer between the first and second ferromagnetic layers. The magnetic coupling between the first and second ferromagnetic layers is predominantly magnetostatic.

In a second principal aspect, the present invention provides a magnetoresistive device comprising a first ferromagnetic layer having a first magnetization direction, a second ferromagnetic layer having a second magnetization direction, a third magnetization direction having a third magnetization direction, a first nonmagnetic conductor layer between the first and second ferromagnetic layers, and a second nonmagnetic conductor layer between the second and third ferromagnetic layers. The magnetoresistive device has a variable resistance that varies with applied magnetic field over a range of applied magnetic fields. The variable resistance is characterized by a hysteresis curve that is substantially symmetric about zero applied magnetic field.

DETAILED DESCRIPTION OF EXEMPLARY EMBODIMENTS

Figure 4:
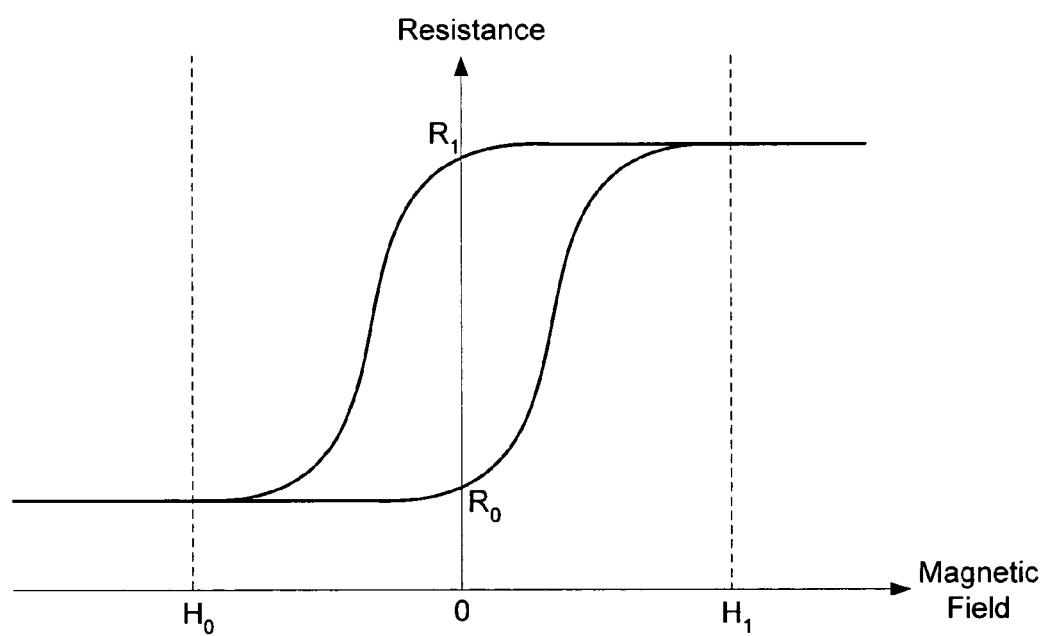
FIG. 4 is a graph of resistance versus applied magnetic field, showing a hysteresis curve of a giant magnetoresistive device, in accordance with a preferred embodiment of the present invention.

The present invention, in its preferred embodiments, provides GMR devices, such as spin valves or pseudo spin valves, with hysteresis curves that are substantially symmetric about zero applied magnetic field. FIG. 4 shows an example of such a substantially symmetric hysteresis curve. As shown in FIG. 4, the difference between the highest resistance and lowest resistance is maximal at near zero applied magnetic field. The highest zero-field resistance, $R_1$, may be achieved by applying and then removing magnetic field, $H_1$, and the lowest zero-field resistance, $R_0$, may be achieved by applying and then removing magnetic field $H_0$. Ideally, $H_1$ and $H_0$ represent magnetic fields of the same magnitude but opposite direction, so that they can be generated by the same word current flowing in opposite directions. Although FIG. 4 illustrates a perfectly symmetric hysteresis curve, it is to be understood that GMR devices with hysteresis curves that are substantially, though not perfectly, symmetric can also result in good performance in MRAM applications.

Figure 1:
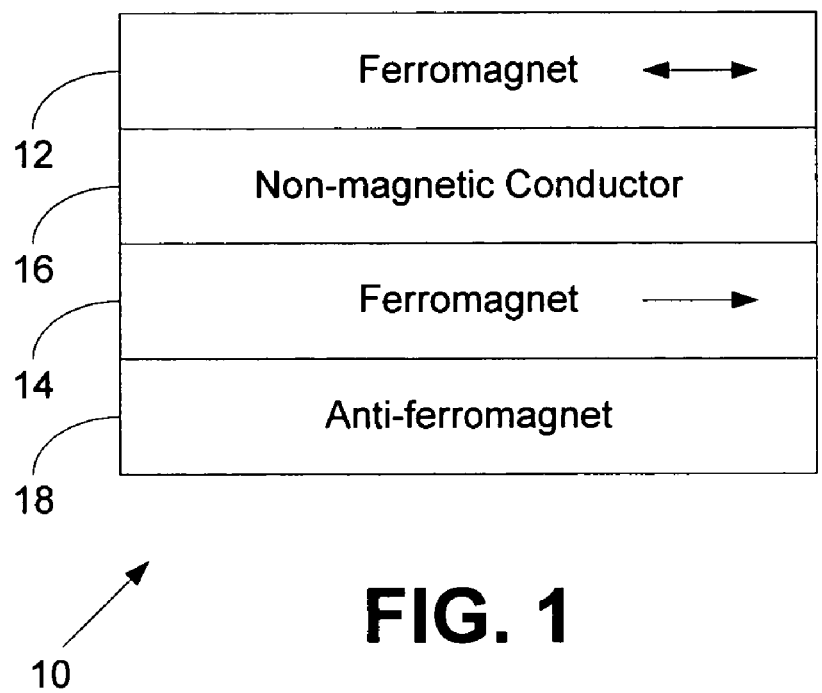
FIG. 1 is a schematic view of the layers of a prior art spin valve device.
Figure 2:
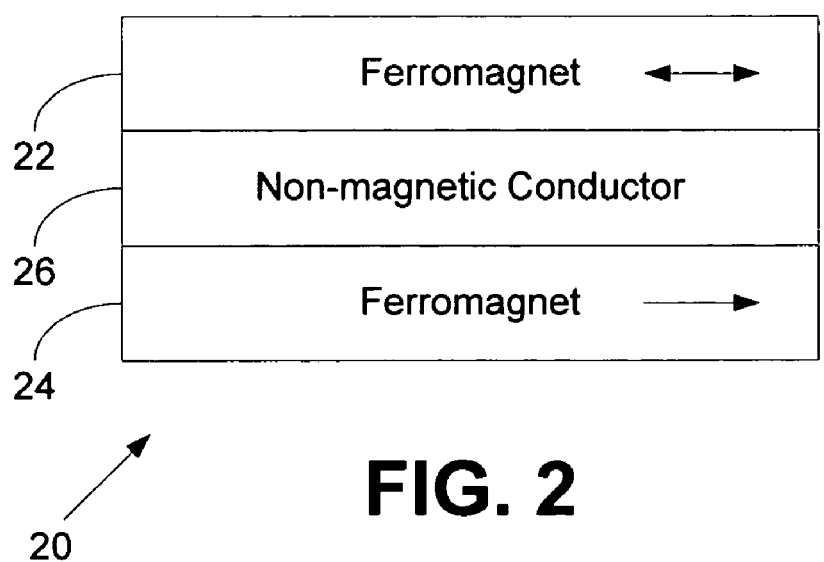
FIG. 2 is a schematic view of the layers of a prior art pseudo spin valve device.
Figure 3:
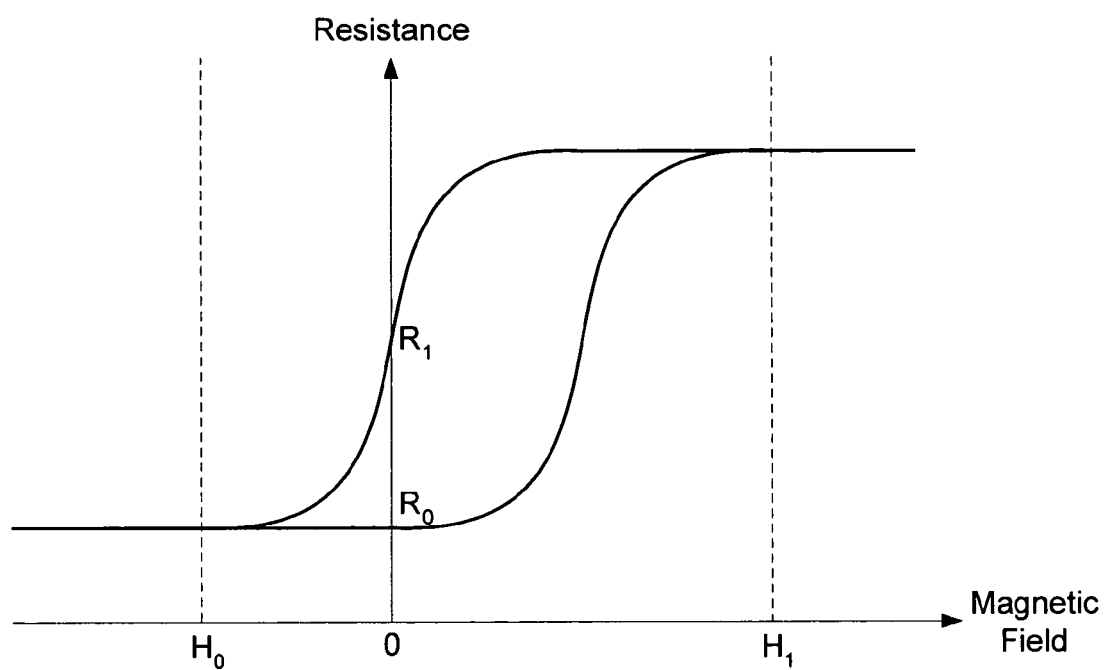
FIG. 3 is a graph of resistance versus applied magnetic field, showing a hysteresis curve of a prior art giant magnetoresistive device.

It is believed that asymmetric or biased hysteresis characteristics, such as shown in FIG. 3, typically results from magnetostatic coupling between the reference and switching layers. In accordance with the present invention, the extent of this magnetostatic coupling or bias may be adjusted by splitting the reference layer and/or switching layer into multiple, i.e., at least two, ferromagnetic layers separated by nonmagnetic conductor layers. Splitting the reference and/or switching layers in this way may allow the amount of stray magnetic flux affecting the switching layer to be adjusted and may also compensate for other magnetic coupling effects.

1. Exemplary Bias-Adjusted Pseudo Spin Valve Construction

Figure 5:
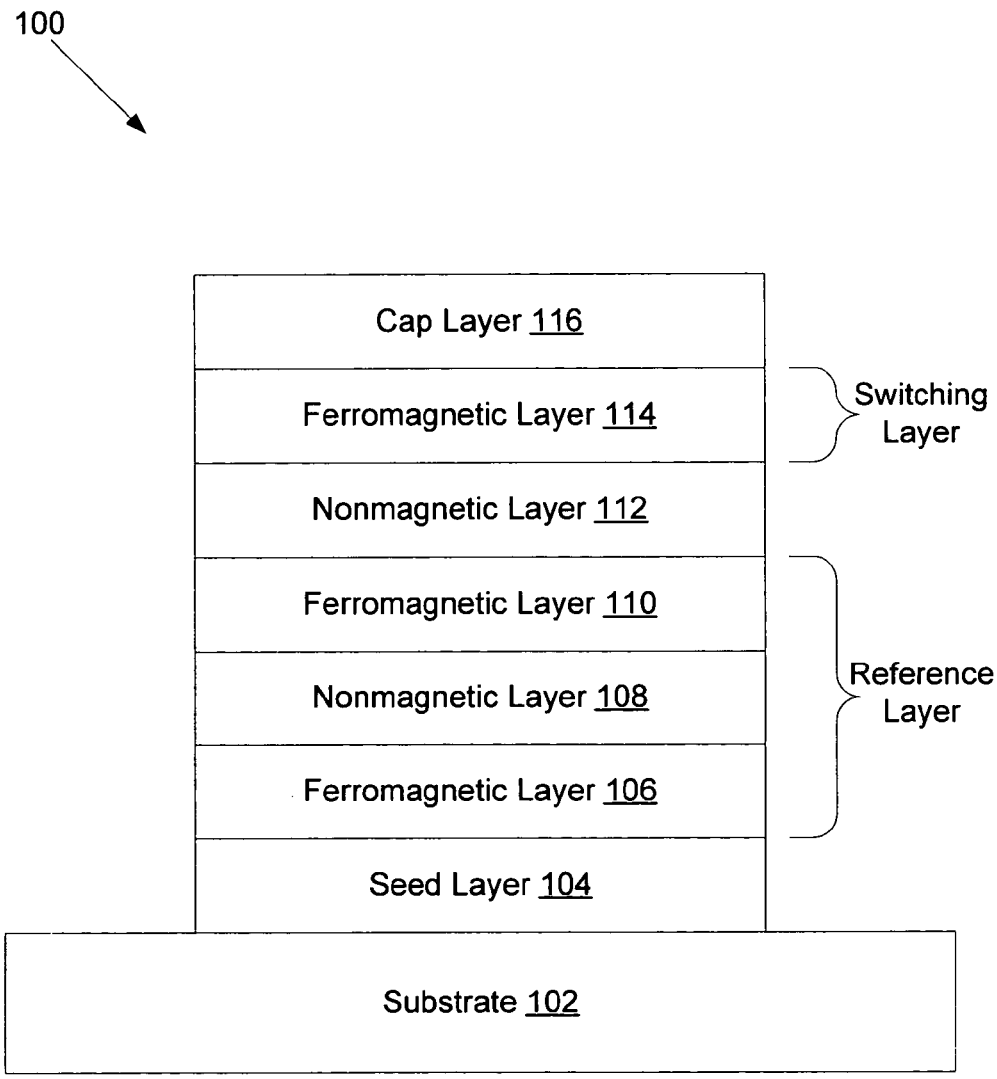
FIG. 5 is a schematic view of the layers of a pseudo spin valve device, in accordance with a preferred embodiment of the present invention.

FIG. 5 shows the layers of an exemplary bias-adjusted pseudo spin valve 100 on a substrate 102. In an exemplary embodiment, substrate 102 includes one or more layers of a dielectric, such as silicon oxide, e.g., $SiO_2$, or silicon nitride, e.g., $Si_3N_4$, which may be grown or deposited on a silicon wafer. However, other materials may be used for substrate 102. For example, substrate 102 may be fabricated from non-magnetic materials, such as oxides, nitrides, borides, carbides, metals, glass, or polymers.

A seed layer 104 may be formed atop substrate 102 in order to facilitate the formation of the metal layers above it in pseudo spin valve 100. In an exemplary embodiment, seed layer 104 is a metal such as tantalum. The thickness of seed layer 104 may range from about 10 to 100 Ångstroms, depending on the materials used. Thus, in a typical example, seed layer 104 may be about 50 Ångstroms of tantalum.

The reference layer of pseudo spin valve 100 is formed on seed layer 104. In the example of FIG. 5, the reference layer is split into a ferromagnetic layer 106, a nonmagnetic layer 108, and a ferromagnetic layer 110. Ferromagnetic layers 106 and 110 include ferromagnetic materials, such as iron, nickel, cobalt and/or alloys thereof. Nonmagnetic layer 108 is a nonmagnetic conductor, such as copper. Nonmagnetic layer 108 may be relatively thin but still thick enough to space ferromagnetic layers 106 and 110 sufficiently apart such that the magnetic coupling between ferromagnetic layers 106 and 110 is predominantly magnetostatic. For example, nonmagnetic layer 108 may be about 5 to 35 Ångstroms of copper. The thickness of each of ferromagnetic layers 106 and 110 may, for example, range from about 10 to about 120 Ångstroms.

Ferromagnetic layers 106 and 110 have magnetization directions that remain substantially fixed over a range of applied magnetic fields, e.g., the applied magnetic fields used to store data in pseudo spin valve 100. In general, the magnetizations of ferromagnetic layers 106 and 110, relative to one another, may be parallel, antiparallel, or in some other relative orientation. Preferably, the relative orientations of the magnetizations of ferromagnetic layers 106 and 110 is not constrained by exchange coupling. The particular magnetizations and thicknesses of ferromagnetic layers 106 and 110 may be chosen so that the hysteresis curve of pseudo spin valve 100 is substantially symmetric.

Although in the example shown in FIG. 5, the reference layer includes two ferromagnetic layers, the reference layer may, in general include a greater or fewer number of ferromagnetic layers. Thus, in some embodiments, the reference layer may include three ferromagnetic layers separated by two nonmagnetic layers. In other embodiments, the reference layer may include a single ferromagnetic layer, and the switching layer may be split into multiple ferromagnetic layers.

A nonmagnetic layer 112 is formed on ferromagnetic layer 110. Nonmagnetic layer 112 is a nonmagnetic conductor, such as copper, and may have a thickness in the range of 5 to 35 Ångstroms. The switching layer of pseudo spin valve 100 is formed on nonmagnetic layer 112. In the example of FIG. 5, the switching layer consists of a single ferromagnetic layer 114. Ferromagnetic layer 114 includes ferromagnetic materials, such as iron, nickel, cobalt and/or alloys thereof. In an exemplary embodiment, the thickness of ferromagnetic layer 114 is in the range of 10 to 60 Ångstroms. Ferromagnetic layer 114 has a magnetization direction that changes orientation relative to that of ferromagnetic layers 106 and 110 over a range of applied magnetic fields, e.g., the applied magnetic fields used to store data in pseudo spin valve 100.

Although the embodiment shown in FIG. 5 has only a single ferromagnetic layer in the switching layer, alternatively, the switching layer may include multiple ferromagnetic layers separated by nonmagnetic layers. In the case that the switching layer includes multiple ferromagnetic layers, the magnetic coupling between the ferromagnetic layers is, preferably, predominantly magnetostatic. In addition, the multiple ferromagnetic layers preferably each have a magnetization direction that can be changed by the magnetic fields applied to pseudo spin valve 100.

Pseudo spin valve 100 may also include other layers, depending on the particular application and/or method of fabricating pseudo spin valve. For example, in some embodiments, a cap layer 116 may be formed on ferromagnetic layer 114. Cap layer 116 may be formed, for example, as a passivation layer, diffusion barrier, etch stop, and/or in order to enhance the magnetoresistance of pseudo spin valve 100. Cap layer 116 may consist of only one layer, or cap layer 116 may consist of multiple layers that may include multiple materials. Thus, in an exemplary embodiment, cap layer 116 may include a diffusion barrier, e.g., a layer of tantalum about 10 to 50 Ångstroms thick, in order to prevent the diffusion of materials into ferromagnetic layers 106, 110, and 114 that may potentially degrade the ferromagnetic properties of these layers. In an exemplary embodiment, cap layer 116 may also include an etch stop formed on top of the diffusion barrier in order to facilitate the fabrication of pseudo spin valve 100.

In addition to the layers of pseudo spin valve 100 on substrate 102, a complete device that includes pseudo spin valve 100 may also include other layers, which may be located on top of and/or to the side of pseudo spin valve 100. For example, for MRAM applications, conductors for word current may be formed above pseudo spin valve 100.

Layers 104–116 may be formed using various techniques, including, for example, ion beam deposition, sputtering, plasma vapor deposition, evaporation, and/or molecular beam epitaxy.

2. Exemplary Bias-Adjusted Spin Valve Construction

Figure 6:
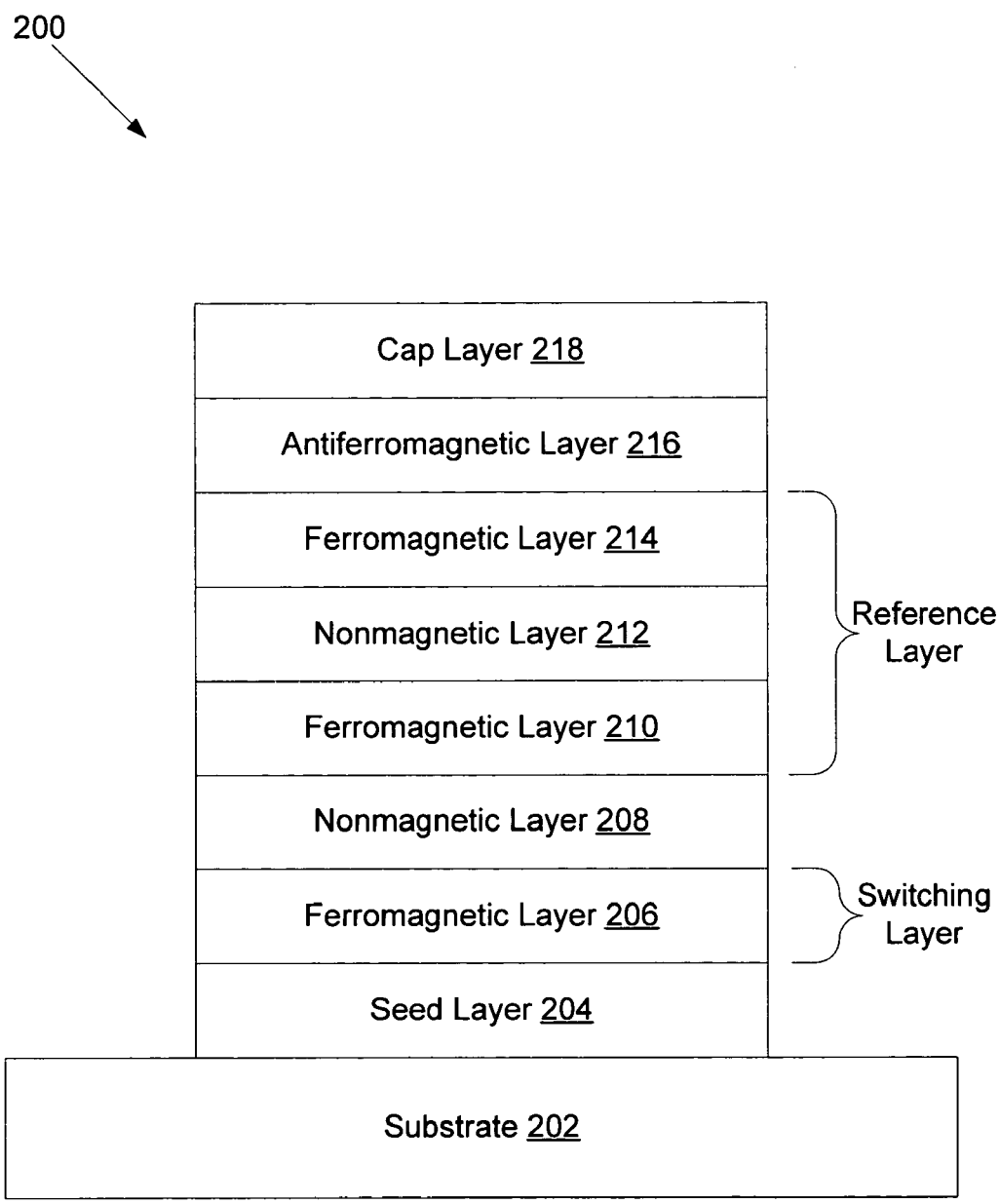
FIG. 6 is a schematic view of the layers of a spin valve device, in accordance with a preferred embodiment of the present invention.

FIG. 6 shows the layers of an exemplary bias-adjusted spin valve 200 on a substrate 202. As set forth below, the construction of spin valve 200 is similar to the construction of pseudo spin valve 100. The main differences are that spin valve 200 includes an antiferromagnet, and the stacking of the reference and switching layers are reversed.

A seed layer 204 is formed on substrate 202 in order to facilitate the formation of the metal layers above it in spin valve 200. Seed layer 204 may be a layer of tantalum, for example. The switching layer is formed on seed layer 204. In the example of FIG. 6, switching layer includes a single ferromagnetic layer 206. Ferromagnetic layer 206 may include ferromagnetic materials, such as iron, nickel, cobalt and/or alloys thereof. A nonmagnetic layer 208, such as copper, is formed on ferromagnetic layer 206.

The reference layer is formed on nonmagnetic layer 208. In the example of FIG. 6, the reference layer is split into a ferromagnetic layer 210, a nonmagnetic layer 212, and a ferromagnetic layer 214. An antiferromagnetic layer 216 is formed on ferromagnetic layer 214. Antiferromagnetic layer 216 may include antiferromagnetic materials, such as FeMn alloys or PtMn alloys.

Spin valve 200 may also include other layers, depending on the particular application and/or method of fabricating pseudo spin valve. For example, in some embodiments, a cap layer 218 may be formed on antiferromagnetic layer 216. Cap layer 218 may be formed, for example, as a passivation layer, diffusion barrier, etch stop, and/or in order to enhance the magnetoresistance of spin valve 200. Cap layer 218 may consist of only one layer, or cap layer 218 may consist of multiple layers that may include multiple materials. Thus, in an exemplary embodiment, cap layer 218 may include a diffusion barrier, e.g., a layer of tantalum about 10 to 50 Ångstroms thick, and an etch stop formed on the diffusion barrier. In addition, other layers may be formed above or to the side of spin valve 200.

Antiferromagnetic layer 216 pins the magnetization of at least ferromagnetic layer 214 into a particular orientation. As a result, the magnetization direction of ferromagnetic layer 214 remains substantially fixed over a range of applied magnetic fields. Preferably, the magnetic coupling between ferromagnetic layer 210 and 214 is predominantly magnetostatic, so that the magnetization of ferromagnetic layer 210 is not also pinned by antiferromagnetic layer 216. Nonetheless, the anisotropy and switching field of ferromagnetic layer 210 is sufficiently high that its magnetization direction also remains relatively fixed over the range of applied magnetic fields. In contrast, the magnetization direction of ferromagnetic layer 206 changes orientation when magnetic fields are applied.

Although the reference layer includes two ferromagnetic layers in the embodiment shown in FIG. 6, the reference layer may include a greater or fewer number of ferromagnetic layers. In addition, although the switching layer is shown with only a single ferromagnetic layer, the switching layer may include multiple ferromagnetic layers separated by nonmagnetic layers. In any event, either the reference layer and/or the switching layer is split into multiple ferromagnetic layers in order to achieve a hysteresis curve that is substantially symmetric, such as shown in FIG. 4.

Layers 204–218 may be formed using various techniques, including, for example, ion beam deposition, sputtering, plasma vapor deposition, evaporation, and/or molecular beam epitaxy.

3. Exemplary MRAM Memory Element Architectures

Figure 7:
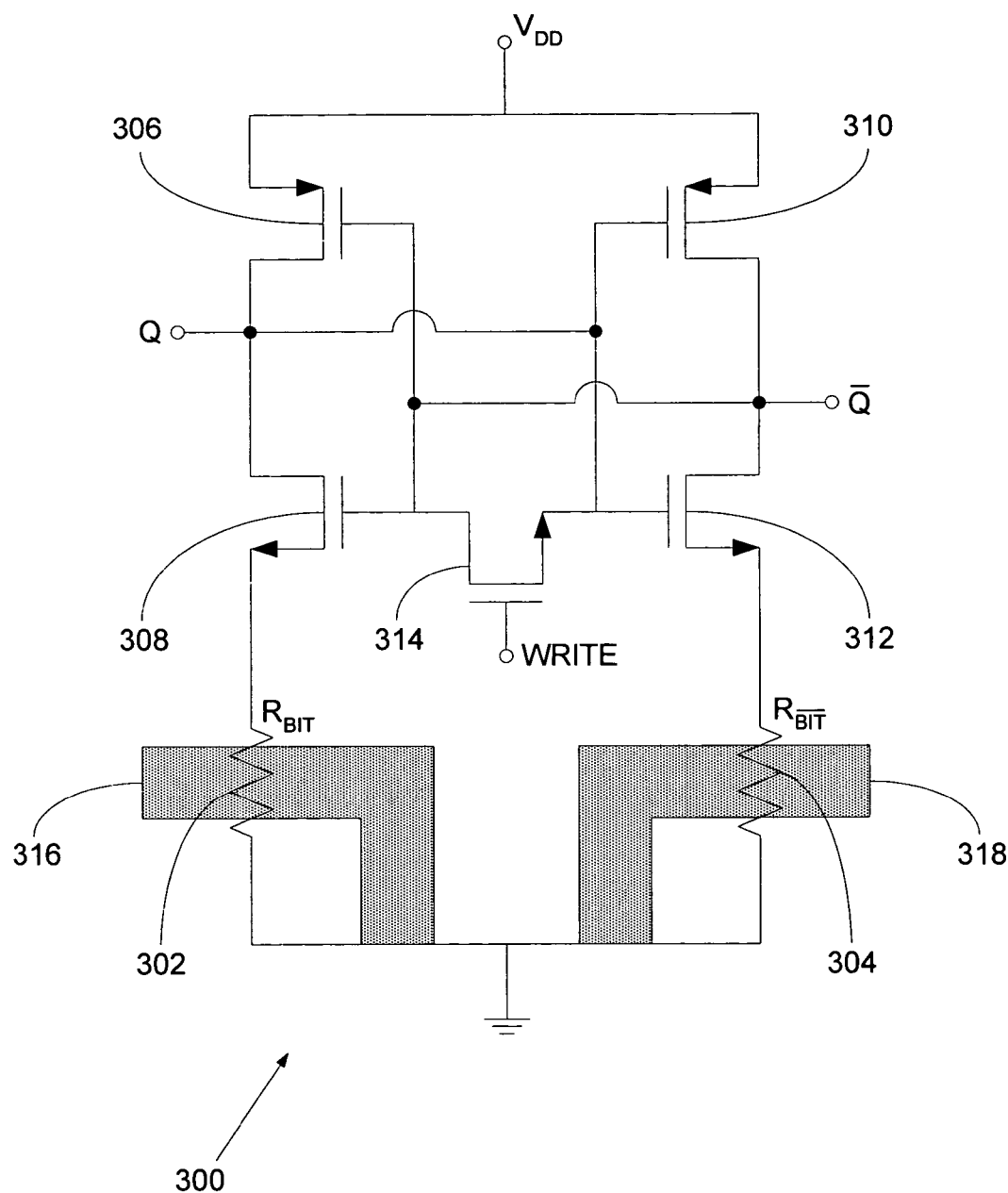
FIG. 7 is a schematic diagram of a "2R5T" memory element in accordance with a preferred embodiment of the present invention.

One application of the bias-adjusted spin valves and pseudo spin valves of the present invention is in MRAM memory elements. FIG. 7 is a schematic diagram showing an exemplary MRAM memory element 300, in which the bias-adjusted spin valves and pseudo spin valves of the present invention can be used. Memory element 300 includes magnetoresistive elements 302 and 304, which may, for example, be spin valves or pseudo spin valves. Memory element 300 also includes transistors 306, 308, 310, and 312 connected together in a latching configuration. In addition, a reset or write transistor 314 is connected between the gate terminals of transistors 308 and 312. Because of the presence of two resistors and five transistors, this memory element configuration may be referred to as a "2R5T" architecture.

In this configuration, transistors 306 and 308 function as a first inverter, which is connected to a power supply terminal, $V_{DD}$, and connected to ground via magnetoresistive element 302. Transistors 310 and 312 function as a second inverter, which is connected to a power supply terminal, $V_{DD}$, and connected to ground via magnetoresistive element 304. The first and second inverters are connected together in a cross-coupled configuration as shown in FIG. 7. In addition, transistor 314 is arranged so that, when transistor 314 is turned on, it substantially equalizes the voltages at the inputs of the first and second invertors.

Memory element 300 also includes word lines 316 and 318 that direct word currents from a current source (not shown) to ground. Word lines 316 and 318 are arranged near magnetoresistive elements 302 and 304, respectively, so that the word currents can generate magnetic fields sufficient to change the logical states of magnetoresistive elements 302 and 304. More particularly, word lines 316 and 318 are arranged such that the word currents flowing to ground apply magnetic fields to magnetoresistive elements 302 and 304 in opposite directions. In this way, word currents of the same magnitude flowing through word lines 316 and 318 program magnetoresistive elements 302 and 304 into opposite logical states. Because magnetoresistive elements 302 and 304 exhibit substantially symmetric hysteresis characteristics, as illustrated by FIG. 4, this use of word currents to program magnetoresistive elements 302 and 304 into opposite logical states may be facilitated.

To use memory element 300, magnetoresistive elements 302 and 304 are first programmed into the desired logical states by word currents flowing through word lines 316 and 318. Then, when the first and second inverters are either powered up by $V_{DD}$ or reset by turning on transistor 314, the first and second inverters assume a latched state that corresponds to the logical states of magnetoresistive elements 302 and 304. The latched state of memory element 300 may be sensed at the "Q" terminals.

Figure 8:
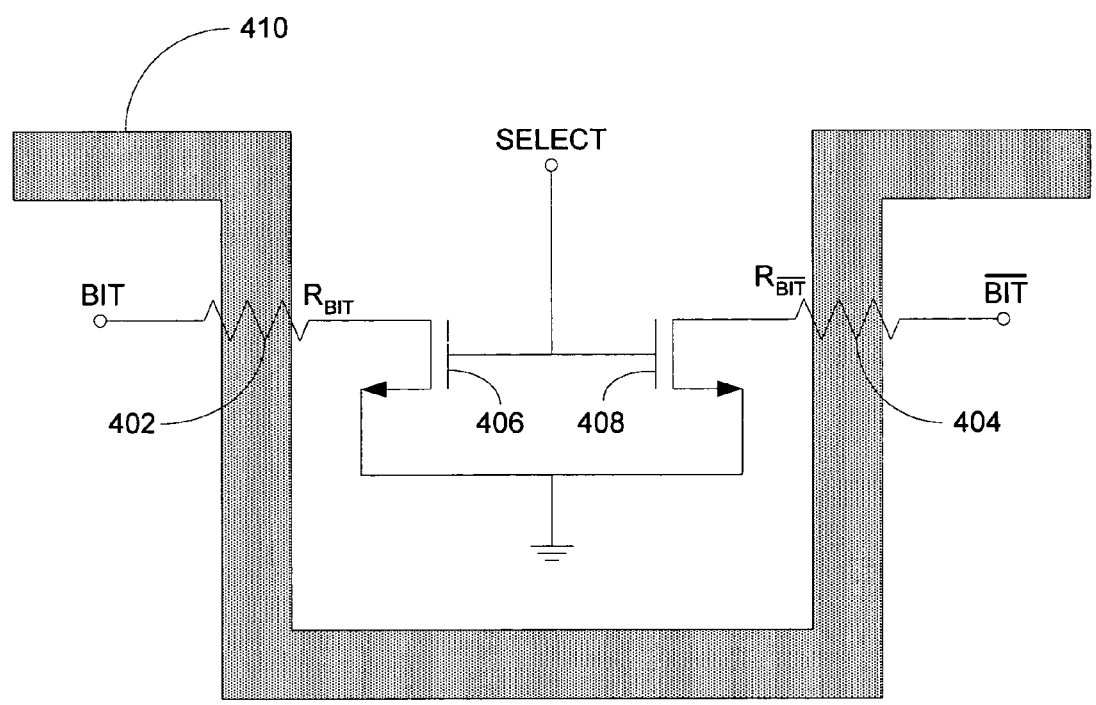
FIG. 8 is a schematic diagram of a "2R2T" memory element in accordance with a preferred embodiment of the present invention.

FIG. 8 shows another exemplary MRAM memory element 400 in which the bias-adjusted spin valves and pseudo spin valves of the present invention may be used. Memory element 400 includes magnetoresistive elements 402 and 404, which may, for example, be spin valves or pseudo spin valves. Magnetoresistive elements 402 and 404 are connected to ground via transistors 406 and 408, respectively. The gates terminals of transistors 406 and 408 are connected to a "SELECT" line that may be used to turn these transistors on and, thereby, sense the resistance of magnetoresistive elements 402 and 404. Because of the presence of two resistors and two transistors, this memory element configuration may be referred to as a "2R2T" architecture.

A word line 410 is arranged near magnetoresistive elements 402 and 404 so that the word current flowing through word line 410 applies magnetic fields to magnetoresistive elements 402 and 404 in opposite directions. In this way, the same word current may be used to program magnetoresistive elements 402 and 404 into opposite logical states. Because magnetoresistive elements 402 and 404 exhibit substantially symmetric hysteresis characteristics, as illustrated by FIG. 4, the ability to use the same word current to program magnetoresistive elements 402 and 404 into opposite logical states may be facilitated.

Once magnetoresistive elements are programmed in this way, memory element 400 may be selected by a "SELECT" voltage that turns on transistors 406 and 408. The resistances of magnetoresistive elements 402 and 404, and, thus, the logical state of memory element 400, may then be sensed through the "BIT" lines. In practice, the "BIT" lines may be connected to a latch to provide a latched output.

4. Conclusion

Exemplary embodiments of the present invention have been described above. Thus, references to specific thicknesses, materials, and fabrication methods are meant to be illustrative rather than limiting. Those skilled in the art will understand that changes and modifications may be made to these embodiments without departing from the true scope and spirit of the invention, which is defined by the claims.

What is claimed is:

1. A magnetoresistive device having a resistance that can be changed by applying a magnetic field, said magnetoresistive device comprising:

a reference layer, said reference layer having a first magnetization direction that remains substantially fixed when said magnetic field is applied;

a switching layer, said switching layer having a second magnetization direction that changes orientation relative to said first magnetization direction when said magnetic field is applied; and a first nonmagnetic conductor layer between said reference layer and said switching layer, wherein at least one of said reference and switching layers includes at least a first ferromagnetic layer, a second ferromagnetic layer, and a second nonmagnetic conductor layer between said first and second ferromagnetic layers, wherein magnetic coupling between said first and second ferromagnetic layers is predominantly magnetostatic, wherein said magnetoresistive device has a first state, in which said magnetoresistive device has a first zero-field resistance, and a second state, in which said magnetoresistive device has a second zero-field resistance, wherein said magnetoresistive device can be switched from said first state to said second state by applying said magnetic field in a first direction, provided that said magnetic field exceeds a first threshold magnitude, and said magnetoresistive device can be switched from said second state to said first state by applying said magnetic field in a second direction opposite to said first direction, provided that said magnetic field exceeds a second threshold magnitude, and wherein said first and second threshold magnitudes are substantially equal.

2. The magnetoresistive device of claim 1, wherein said first nonmagnetic conductor layer comprises copper.

3. The magnetoresistive device of claim 1, wherein said second nonmagnetic conductor layer comprises copper.

4. The magnetoresistive device of claim 1, further comprising:

an antiferromagentic layer magnetically coupled to said reference layer.

5. The magnetoresistive device of claim 2, wherein said magnetoresistive device is a spin valve.

6. The magnetoresistive device of claim 1, wherein said reference layer has a higher switching field than said switching layer.

7. The magnetoresistive device of claim 6, wherein said magnetoresistive device is a pseudo spin valve.

8. The magnetoresistive device of claim 7, wherein said reference layer is thicker than said switching layer.

9. The magnetoresistive device of claim 1, wherein said first and second magnetization directions are substantially parallel in said first state and said first and second magnetization directions are substantially antiparallel in said second state.

* * * * *